(12) United States Patent
Koide et al.

(10) Patent No.: US 7,405,959 B2
(45) Date of Patent: Jul. 29, 2008

(54) FERROELECTRIC MEMORY DEVICE

(75) Inventors: Yasunori Koide, Matsumoto (JP); Hiroyoshi Ozeki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/566,706

(22) Filed: Dec. 5, 2006

(65) Prior Publication Data

US 2007/0133252 A1    Jun. 14, 2007

(30) Foreign Application Priority Data

Dec. 6, 2005    (JP) ............................. 2005-352433

(51) Int. Cl.
*G11C 11/22* (2006.01)
(52) U.S. Cl. ....................................... 365/145; 365/117
(58) Field of Classification Search ................. 365/145, 365/117
See application file for complete search history.

(56) References Cited

U.S. PATENT DOCUMENTS

2004/0047172 A1 * 3/2004 Komatsuzaki ............... 365/145
2005/0024915 A1 * 2/2005 Kang ......................... 365/145
2005/0135141 A1 * 6/2005 Kang ......................... 365/145
2005/0207203 A1 * 9/2005 Kang ......................... 365/145

FOREIGN PATENT DOCUMENTS

JP    2001-167591    6/2001

* cited by examiner

*Primary Examiner*—Thong Q Le
(74) *Attorney, Agent, or Firm*—Harness, Dickey & Pierce, P.L.C.

(57) ABSTRACT

A ferroelectric memory device includes memory cells using ferroelectric capacitors provided at intersections of local bit lines associated with a main bit line and word lines. The ferroelectric memory device includes: first and second local bit lines associated with a first main bit line; first and second connection transistors for connecting the first and second local bit lines to the first main bit line; first and second grounding transistors for grounding the first and second local bit lines; a first selection line that is commonly connected to gates of the first grounding transistor and the second connection transistor; and a second selection line that is commonly connected to gates of the first connection transistor and the second grounding transistor.

8 Claims, 4 Drawing Sheets

FERROELECTRIC MEMORY DEVICE

The entire disclosure of Japanese Patent Application No.2005-352433, filed Dec. 6, 2005 is expressly incorporated by reference herein.

BACKGROUND

1. Technical Field

The present invention relates to ferroelectric memory devices.

2. Related Art

In a ferroelectric memory device, a potential appearing on a hit line at the time of normal reading becomes a potential that is voltage-divided by a ferroelectric capacitor and a bit line capacitance. Accordingly, to widen the potential difference of a bit line to secure a sufficient sensing margin, the bit line capacitance is required to be reduced.

As a method to reduce the bit line capacitance, for example, a hierarchized bit line method is known. For example, Japanese laid-open patent application JP-A-2001-167591 describes an example of related art. In the hierarchized bit line method, a plurality of local bit lines, each being connected to a predetermined number of memory cells, is associated with each of main bit lines, and transfer gates that can connect the main bit line and the local bit lines are controlled, whereby any of the local bit lines associated with selected ones of the memory cells is connected to the main bit line. By this method, the junction capacitance of memory cells on the main bit line can be reduced.

However, according to a conventional device structure, when the device structure is miniaturized, an inter-wiring capacitance of adjacent ones of the bit lines greatly influences as a bit line capacitance, such that the bit line capacitance may not be sufficiently reduced. Also, the sensing margin might be deteriorated by noise interference.

SUMMARY

In accordance with an advantage of some aspects of the present invention, there are provided ferroelectric memory devices which can improve the sensing margin while simplifying the circuit structure and reducing the bit line capacitance.

(1) A ferroelectric memory device in accordance with an embodiment of the invention pertains to a ferroelectric memory device having memory cells using ferroelectric capacitors provided at intersections of local bit Lines associated with a main bit line and word lines, and the ferroelectric memory device includes: first and second local bit lines associated with a first main bit line; first and second connection transistors for connecting the first and second local bit lines to the first main bit line; first and second grounding transistors for grounding the first and second local bit lines; a first selection line that is commonly connected to gates of the first grounding transistor and the second connection transistor; and a second selection line that is commonly connected to gates of the first connection transistor and the second grounding transistor.

According to the structure described above, when a potential that turns on the transistors described above is supplied to one of the first and second selection lines, one of the first and second local bit lines is connected to the first main bit line, and the other is grounded. In other words, among two memory cells on the first and second local bit lines, respectively, which are selected by a common word line, information in one of the memory cells is read out and information in the other is retained. By this structure, the common word line can simultaneously control two memory cells associated with each main bit line, such that the number of main bit lines can be reduced without reducing the memory capacity. Accordingly, by the structure described above, the junction capacitance of memory cells can not only be reduced by a so-called hierarchized bit line method, but the inter-wiring capacitance between the bit lines can also be reduced as the pitch between adjacent ones of the main bit lines can be widened. Accordingly, the circuit structure can be simplified, the bit line capacitance can be sufficiently reduced, noise interference among bit lines can be reduced, the sensing margin can be improved, and higher operation speeds can be achieved.

(2) The ferroelectric memory device in accordance with an aspect of the embodiment of the invention may further include: a second main bit line adjacent to the first main bit line; third and fourth local bit lines associated with the second main bit line; third and fourth connection transistors for connecting the third and fourth local bit lines to the second main bit line; and third and fourth grounding transistors for grounding the third and fourth local bit lines, wherein gates of the third connection transistor and the fourth grounding transistor may be commonly connected by the first selection line, and gates of the third grounding transistor and the fourth connection transistor may be commonly connected by the second selection line.

(3) The ferroelectric memory device in accordance with an aspect of the embodiment of the invention may further include a plate line provided intersecting the word line, and a plate line driving section that drives the plate line.

(4) In the ferroelectric memory device in accordance with an aspect of the embodiment of the invention, the plate line driving section may be provided at each of the first through fourth local bit lines.

(5) In the ferroelectric memory device in accordance with an aspect of the embodiment of the invention, the plate line driving section may be commonly shared by the second and third local bit lines.

(6) In the ferroelectric memory device in accordance with an aspect of the embodiment of the invention, the plate line driving section may include a first plate line driving section that is commonly shared by at least the first and fourth local bit lines, and a second plate line driving section that is commonly shared by at least the second and third local bit lines.

(7) In the ferroelectric memory device in accordance with an aspect of the embodiment of the invention, the first through fourth local bit lines may be arranged such that common operation states controlled based on the respective first and second selection lines are continuous in a direction of the word lines.

(8) In the ferroelectric memory device in accordance with an aspect of the embodiment of the invention, a common one of the word lines may traverse the first through fourth local bit lines.

DESCRIPTION OF EXEMPLARY EMBODIMENTS

Preferred embodiments of the invention are described below with reference to the accompanying drawings.

1. Structure of Ferroelectric Memory Device

Figure 1:
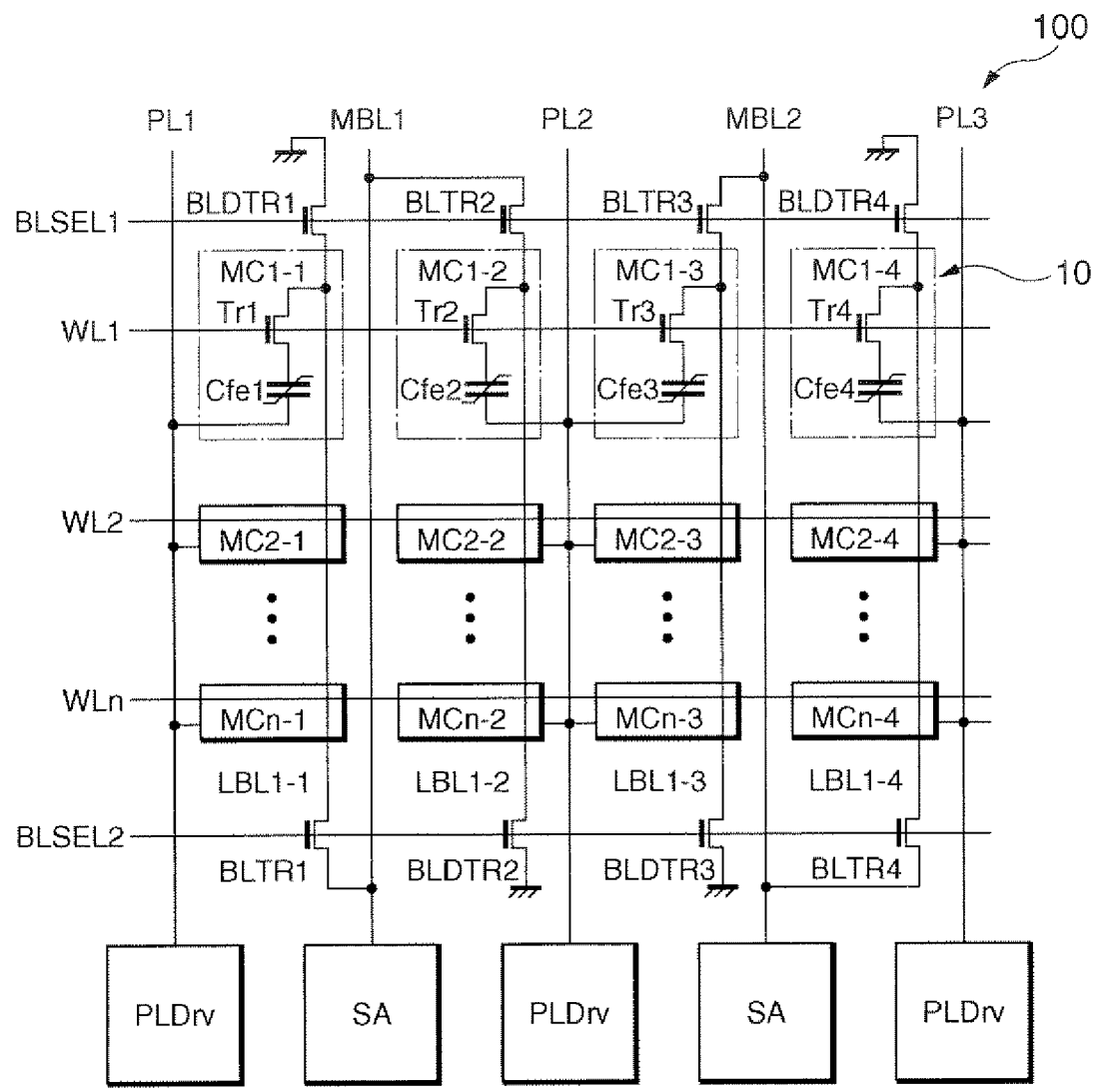
FIG. 1 is a circuit diagram of an example of a ferroelectric memory device in accordance with an embodiment of the invention.

FIG. 1 is a circuit diagram of an example of a ferroelectric memory device in accordance with an embodiment of the invention.

A ferroelectric memory device (semiconductor memory device) 100 includes a memory cell array 10. The memory cell array 10 includes a plurality of memory cells MC1-1 through MCn-4, each including a ferroelectric capacitor. In the example shown in FIG. 1, for example, the memory cell MC1-1 includes a ferroelectric capacitor Cfe1, and a transistor Tr1 (for example, an n-type MOS transistor). The ferroelectric capacitor Cfe1 has one end connected one of a source and a drain (source/drain) of the transistor Tr1, and the other end connected to a plate line PL1. Also, the transistor Tr1 has a gate connected to a word line WL1, one of its source/drain connected to a local bit line LBL1-1, and the other connected to one end of the ferroelectric capacitor Cfe1. It is noted that the memory cell is not limited to the structure shown in FIG. 1. The memory cell shown in FIG. 1 is applicable not only to a so-called 1T1C (1 transistor and 1 capacitor) type, but also to a 2T2C type, an FET type and the like.

In the ferroelectric memory device 100, a plurality of word lines WL1-WLn, and a plurality of main bit lines MBL1, 2, etc. are disposed in a manner to traverse one another. Each of the main bit lines connects to a sense amplifier SA. In the present embodiment, a so-called hierarchized bit line method is adopted. In the example shown in FIG. 1, first and second local bit lines LBL1-1 and LBL1-2 correspond to the first main bit line MBL1, and third and fourth local bit lines LBL1-3 and LBL1-4 correspond to the second main bit line MBL2 that is disposed next to the first main bit line MBL1. Although not shown, each of the main bit lines MBL1-MBLm is connected to a plurality of local bit lines LBLx-y. Also, word lines WL1-WLn commonly traverse the first through fourth local bit lines LBL1-1 through LBL1-4 that are arranged next to each other in a direction of the word lines. It is noted that other local bit lines LBLx-y other than the illustrated local bit lines may be associated with each of the main bit lines. In this case, other word lines not shown traverse the other local bit lines, and other memory cells not shown are disposed at intersections of these other local bit lines and the other words lines.

At intersections of the first through fourth local bit lines LBL1-1 through LBL1-4 and the plurality of word lines WL1-WLn, memory cells MC1-1 through MCn-4 are provided, respectively. For example, referring to the first line of the memory cell array 10, the memory cells MC1-1 through MC1-4 are connected to the first through fourth local bit lines LBL1-1 through LBL1-4, and gates of the transistors Tr1 through Tr4 of the respective memory cells are commonly connected to the word line WL1.

First through fourth connection transistors BLTR1-4 (for example, n-type MOS transistors) are provided between the first through fourth local bit lines LBL1-1-LBL1-4 and the main bit lines MBL1 and MBL2 corresponding to the respective local bit lines. Each of the first through fourth connection transistors BLTR1-4 has one of source/drain connected to corresponding one of the local bit lines LBL1-1 through LBL1-4, and the other connected to associated one of the main bit lines MBL1 and MBL2. In other words, the first through fourth connection transistors BLTR1-BLTR4 function as switching elements for connecting each of the local bit lines to the main bit lines.

Further, first through fourth grounding transistors BLDTR1-4 (for example, n-type MOS transistors) are provided between the first through fourth local bit lines LBL1-1 through LBL1-4 and the ground potential. Each of the first through fourth grounding transistors BLDTR1-BLDTR4 has one of source/drain connected to corresponding one of the local bit lines LBL1-1 through LBL1-4, and the other grounded. The first through fourth grounding transistors BLDTR1-BLDTR4 function as switching elements for discharging the corresponding local bit lines.

The first connection transistor BLTR1 and the grounding transistor BLDTR1 connected to the first local bit line LBL1-1 and the second connection transistor BLTR2 and the second grounding transistor BLDTR2 connected to the second local bit line LBL1-2 are point-symmetrically disposed through a virtual point as a reference (not shown) on the first main bit line MBL1. This similarly applies to the third and fourth local bit lines LBL1-3 and LBL1-4. In other words, the connection transistors and the grounding transistors associated with one of the main bit lines are provided at mutually opposing positions along the main bit line, respectively.

Electrical connection of the first through fourth local bit lines LBL1-1 through LBL1-4 is controlled based on signals supplied to selection lines BLSEL1 and BLSEL2. It is noted that the first and second selection lines BLSEL1 and BLSE2 are controlled by a selection line driving section (not shown), that supplies a signal at H level only to the selection line corresponding to those of the memory cells to be accessed, and a signal at L level to the other selection lines.

As shown in FIG. 1, in each pair of the local bit lines corresponding to a common main bit line, the gates of a pair of the connection transistors (or a pair of the grounding transistors) are connected to the different selection lines, respectively. By this, when a potential at H level (for example, a power supply potential VDD) is supplied to one of the first and second selection lines BLSEL1 and BLSEL2, one of the local bit lines, associated with the common main bit line, is connected to the main bit line, and the other is grounded.

More concretely, on the first and second local bit lines LBL1-1 and LBL1-2 corresponding to the first main bit line MBL1, the gate of the first connection transistor BLTR1 is connected to the second selection line BLSEL2, and the gate of the second connection transistor BLTR2 is connected to the first selection line BLSEL1. Further, the gate of the first grounding transistor BLDTR1 is connected to the first selection line BLSEL1, and the gate of the second grounding transistor BLDTR2 is connected to the second selection line BLSEL2. In other words, the gates of the first grounding transistor BLDTR1 and the second connection transistor BLTR2 are commonly connected to the first selection line BLSEL1, and the gates of the first connection transistor BLTR1 and the second grounding transistor BLDTR2 are commonly connected to the second selection line BLSEL2. Because of this structure, when a potential at H level (for example, a power supply potential VDD) is supplied to one of the first and second selection lines BLSEL1 and BLSEL2, only one of the first and second local bit lines LBL1-1 and LBL1-2 can be connected to the first main bit line MBL1, and the other can be grounded.

Also, on the third and fourth local bit lines LBL1-3 and LBL1-4 corresponding to the second main bit line MBL2, the gate of the third connection transistor BLTR3 is connected to the first selection line BLSEL1, and the gate of the fourth connection transistor BLTR4 is connected to the second selection line BLSEL2. Further, the gate of the third grounding transistor BLDTR3 is connected to the second selection line BLSEL2, and the gate of the fourth grounding transistor BLDTR4 is connected to the first selection line BLSEL1. In other words, the gates of the third connection transistor BLTR3 and the fourth grounding transistor BLDTR4 are commonly connected to the first selection line BLSEL1, and the gates of the third grounding transistor BLDTR3 and the connection transistor BLTR4 are commonly connected to the second selection line BLSEL2. Because of this structure, when a potential is supplied to one of the first and second selection lines BLSEL1 and BLSEL2, the potential being capable of turning on the subject selection lines, only one of the third and fourth local bit lines LBL1-3 and LBL1-4 can be connected to the second main bit line MBL2, and the other can be grounded.

In the example shown in FIG. 1, in the ferroelectric memory device 100, a plurality of plate lines PL1, PL2, PL3, etc. are provided traversing a plurality of word lines WL1-WLn (in other words, in parallel with the first through fourth local bit lines LBL1-1 through LBL1-4). For example, the plate line PL1 is provided in parallel with the local bit line LBL1-1, and is connected to the ferroelectric capacitors Cfe1 of the plurality of memory cells MC1-1 through MCn-1 that are connected to the first local bit line LBL1-1. Also, the plural plate lines PL1, PL2, PL3, etc. are controlled by plate line driving sections PLDrv, respectively.

The plate line driving section PLDrv may be provided for each of the local bit lines, or may be shared by two or more of the local bit lines. In the example shown in FIG. 1, one of the plate line driving sections PLDrv is commonly shared by the second and third local bit lines LBL1-2 and LBL1-3. On the second and third local bit lines LBL1-2 and LBL1-3, operation states that are controlled based on signals on the respective first and second selection lines BLSEL1 and BLSEL2 are identical, and therefore a control signal from the plate line driving section PLDrv can be commonly shared by the second and third local bit lines LBL1-2 and LBL1-3.

2. Operations of Ferroelectric Memory Device

Figure 2:
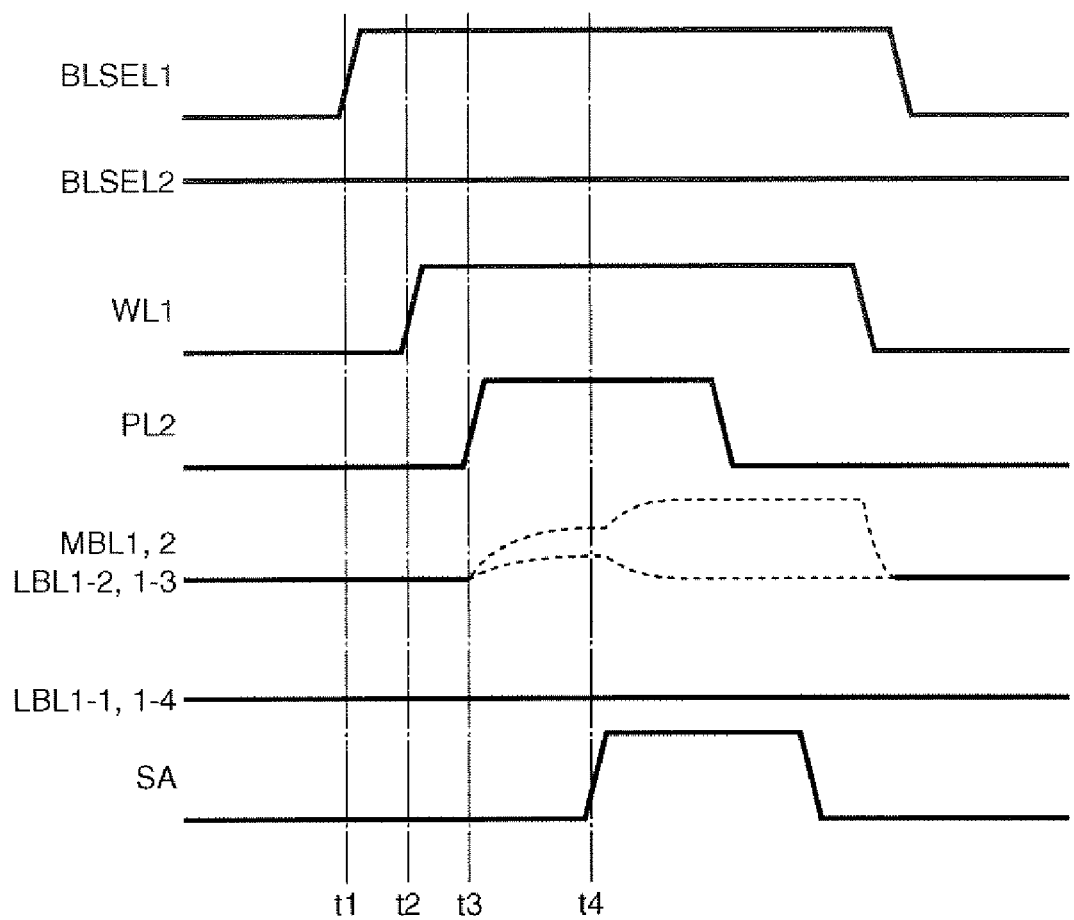
FIG. 2 is a chart for describing waveforms of signals on control lines at the time of data read-out.

Next, an example of operations of the ferroelectric memory device shown in FIG. 1 is described. FIG. 2 shows a chart for describing waveforms of signals on the control lines (word lines, bit lines, etc.) at the time of data read-out.

First, at time t1, a potential at H level (for example, a power supply potential VDD) is supplied to the first selection line BLSEL1, and the second selection line BLSEL2 is maintained at a potential at L level (for example, 0V). By this, the first main bit line MBL1 is connected to the second local bit line LBL1-2 as the second connection transistor BLTR2 turns on, and the second main bit line MBL2 is connected to the third local bit line LBL1-3 as the third connection transistor BLTR3 turns on. At this moment, the first local bit line LBL1-1 is grounded as the first grounding transistor BLDTR1 turns on, and the fourth local bit line LBL1-4 is also grounded as the fourth grounding transistor BLDTR4 turns on.

Then, at time t2, one of the plurality of word lines WL1-WLn is selected. For example, as shown in FIG. 2, the word line WL1 may be selected. In other words, a potential at H level is supplied to the word line WL1. By this, the transistors Tr1-Tr4 of the plural memory cells MC1-1 through MC1-4 that are connected to the word line WL1 turn on, the ferroelectric capacitor Cfe2 of the memory cell MC1-2 is connected to the first main bit line MBL1 through the connection transistor BLTR2, and similarly, the ferroelectric capacitor Cfe3 of the memory cell MC1-3 is connected to the second main bit line MBL2 through the connection transistor BLTR3.

Then, at time t3, a potential at H level is supplied to the plate line PL2 that is connected to the memory cells MC1-2 and MC1-3. By this, charges are retrieved from the ferroelectric capacitors Cfe2 and Cfe3 of the memory cells MC1-2 and MC1-3, and bit potentials corresponding to the data "1" or "0" stored beforehand appear on the first and second main bit lines MBL1 and MBL2, respectively. While the potential at H level is supplied to the plate line PL2, a potential at L level is supplied to the plate lines PL1 and PL3. By this, both ends of the ferroelectric capacitors Cfe1 and Cfe4 of the memory cells MC1-1 and MC1-4 have the same potential (for example, a ground potential) such that no electric field is applied, and the data stored beforehand in the ferroelectric capacitors Cfe1 and Cfe4 are retained without being destroyed.

Finally, at time t4, the sense amplifiers SA are turned on, whereby the bit potentials appeared on the first and second main bit lines MBL1 and MBL2 are amplified, and finally supplied outside as read-out information.

As described above, in the ferroelectric memory device in accordance with the present embodiment, when a potential, which turns on the first and second selection lines BLSEL1 and BLSEL2, is supplied to one of the first and second selection lines BLSEL1 and BLSEL2, one of the first and second local bit lines LBL1-1 and LBL1-2 is connected to the first main bit line MBL1, and the other is grounded. In other words, among the two memory cells MC1-1 and MC1-2 on the first and second local bit lines LBL1-1 and LBL1-2, which are selected by the same word line, information stored in one of the memory cells is read out, and information stored in the other is retained. According to the structure described above, a common word line can concurrently control two memory cells corresponding to each main bit line, such that the number of main bit lines can be reduced without reducing the memory capacity. Accordingly, by the structure described above, the junction capacitance of the memory cells can not only be reduced by a so-called hierarchized bit line method, but the inter-wiring capacitance between the bit lines can also be reduced by widening the pitch between adjacent ones of the main bit lines. Accordingly, the circuit structure can be simplified, the bit line capacitance can be sufficiently reduced, noise interference among bit lines can be reduced, the sensing margin can be improved, and higher operation speeds can be achieved.

Also, it may be derived from the operation details described above that the first through fourth local bit lines LBL1-1 through LBL1-4 are arranged in a manner that identical operation states respectively controlled based on the first and second selection lines BLSEL1 and BLSEL2 continue in the word line direction. In the example shown in FIG. 1, when a potential at H level is supplied to the first selection line BLSEL1, the second and third local bit lines LBL1-2 and LBL1-3 are both connected to the main bit line. In this manner, they are arranged in a manner that the same operation states continue in the word line direction According to such a structure, when the plate lines are provided in parallel with the local bit lines, the second and third local bit lines LBL1-2 and LBL1-3 can be connected to the same plate line PL2 (in other words, to the same plate line driving section) with a very simple layout.

Alternately, the first through fourth local bit lines may be arranged such that different operation states controlled respectively based on the first and second selection lines are alternately repeated in the word line direction. For example, when a potential at H level is supplied to the first selection line, the first local bit line may be grounded, the second local bit line may be connected to the first main bit line, the third local bit line may be grounded, and the fourth local bit line may be connected to the second main bit line. In this manner, the local bit lines may be arranged in a manner that different operation states are alternately repeated in the word line direction. According to such a structure, the local bit lines that are connected to a ground potential are intervened respectively between the plural local bit lines with which controls such as data read-out operations and the like are performed, such that the noise-resistance property can be improved. It is noted that such a structure may be achieved in the circuit structure shown in FIG. 1 by inverting right-to-left the structures respectively connected to the third and fourth local bit lines through the second main bit line as a reference, and providing a plate line and a plate line driving section for each of the local bit lines.

3. Modified Examples

Figure 3:
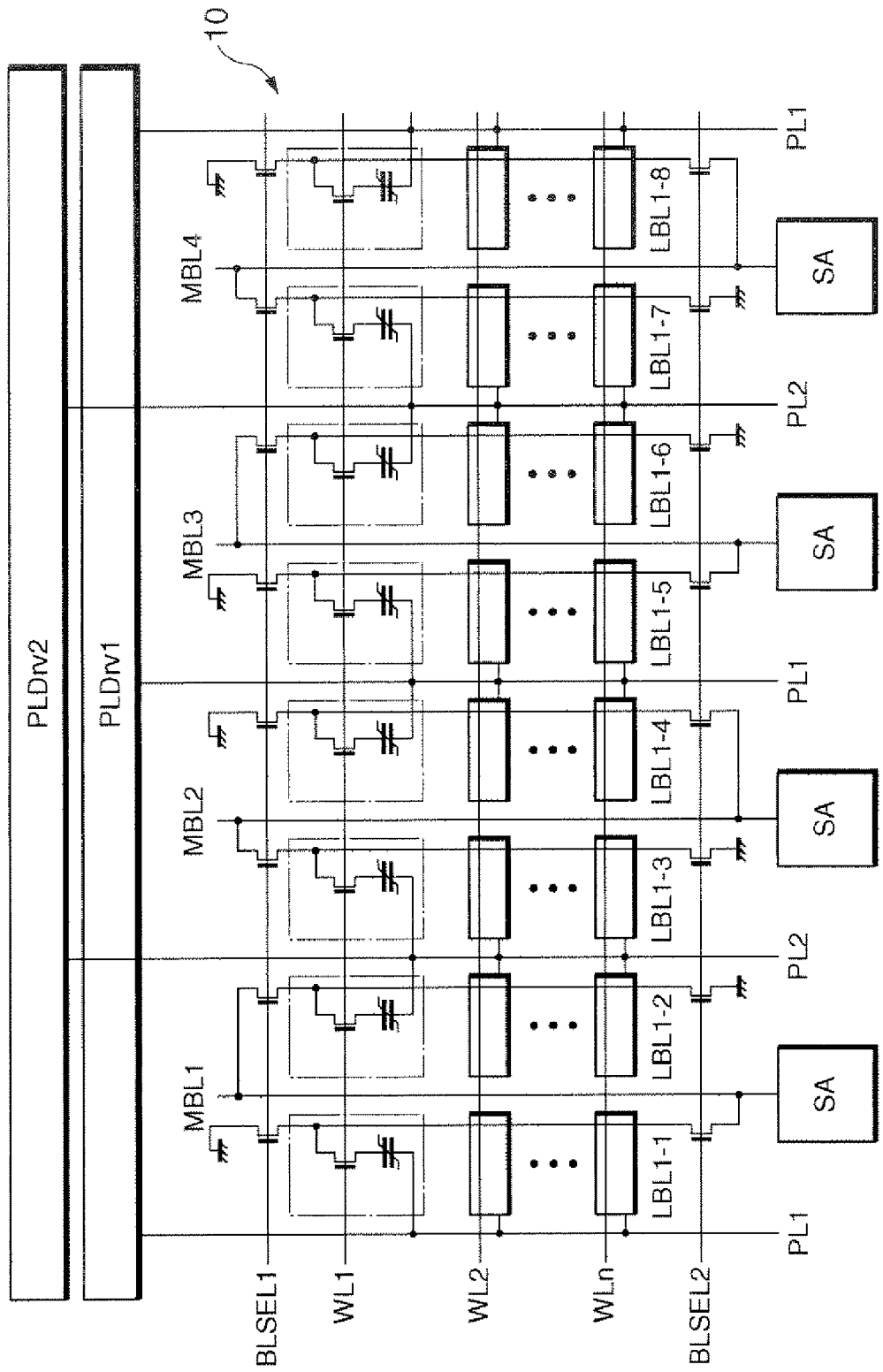
FIG. 3 is a circuit diagram of an example of a ferroelectric memory device in accordance with a modified example of the embodiment of the invention.

FIG. 3 is a circuit diagram of an example of a ferroelectric memory device in accordance with a modified example of the embodiment of the invention. The ferroelectric memory device in accordance with the present modified example is provided with first and second plate line driving sections PLDrv1 and PLDrv2, and plate potentials of the memory cell array 10 are controlled by the first and second plate line driving sections PLDrv1 and PLDrv2. Plate lines PL1 and PL2 connected to the first and second plate line driving sections PLDrv1 and PLDrv2 are provided traversing a plurality of word lines WL1-WLn.

It is noted that, in the circuit diagram shown in FIG. 3, the structures of the first and second main bit lines MBL1 and MBL2 and other elements (including the local bit lines, connection transistors, grounding transistors, word lines and memory cells) may be the same as those shown in FIG. 1 except the plate line driving sections.

In the example shown in FIG. 3, the first plate line driving section PLDrv1 is commonly shared by a plurality of local bit lines in a first group (for example, the first, fourth, fifth and eighth local bit lines LBL1-1, LBL1-4, LBL1-5, LBL1-8), and the second plate line driving section PLDrv2 is commonly shared by a plurality of local bit lines in a second group (for example, the second, third, sixth and seventh local bit lines LBL1-2, LBL1-3, LBL1-6, LBL1-7). According to this structure, driving circuits that generate plate potentials can be commonly shared, such that the circuit structure of the ferroelectric memory device can be simplified and the circuit region can be reduced.

Figure 4:
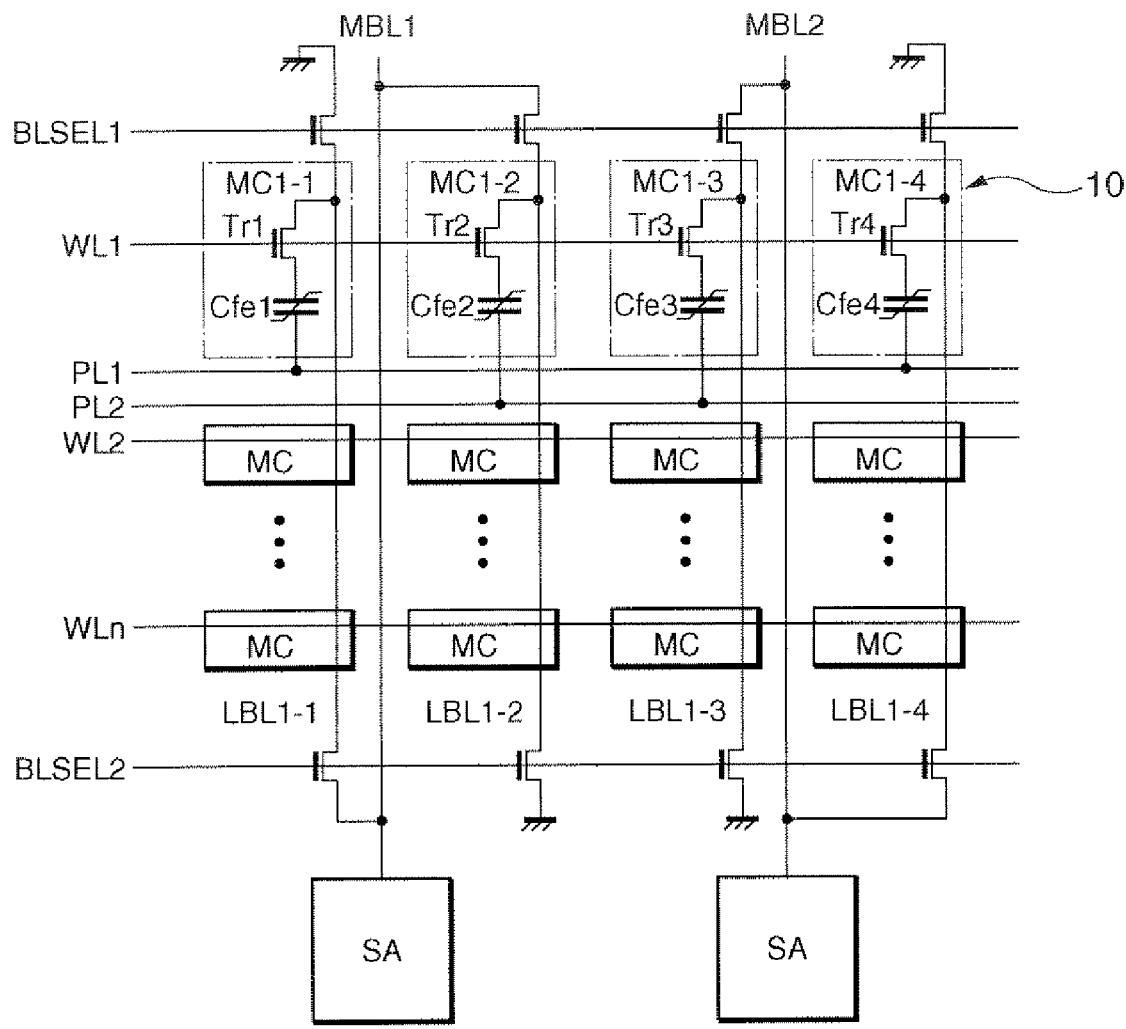
FIG. 4 is a circuit diagram of an example of a ferroelectric memory device in accordance with another modified example of the embodiment of the invention.

FIG. 4 is a circuit diagram showing an example of a ferroelectric memory device in accordance with another modified example of the embodiment of the invention. In the ferroelectric memory device of this modified example, a plurality of plate lines are provided in parallel with a plurality of word lines (in other words, traversing a plurality of local bit lines).

More specifically, two plate lines are provided for each of the word lines WL1-WLn, wherein one of the two plate lines is connected to memory cells that are connected to a plurality of local bit lines belonging to a first group, and the other is connected to memory cells that are connected to a plurality of local bit lines belonging to a second group. For example, referring to the first row of the memory cell array 10, first and second plate lines PL1 and PL2 are provided in parallel with a word line WL1. The first plate line PL1 is connected to memory cells MC1-1 and MC1-4 corresponding to the first and fourth local bit lines LBL1-1 and LBL1-4, and the second plate line PL2 is connected to memory cells MC1-2 and MC1-3 corresponding to the second and third local bit lines LBL1-2 and LBL1-3.

It is noted that the first and second plate lines PL1 and PL2 are controlled by independent plate line driving section (not shown), respectively.

The invention is not limited to the embodiments described above, and many modifications can be made. For example, the invention may include compositions that are substantially the same as the compositions described in the embodiments (for example, a composition with the same function, method and result, or a composition with the same object and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A ferroelectric memory device having memory cells using ferroelectric capacitors provided at intersections of local bit lines associated with a main bit line and word lines, the ferroelectric memory device comprising:

first and second local bit lines associated with a first main bit line;

first and second connection transistors for connecting the first and second local bit lines to the first main bit line;

first and second grounding transistors for grounding the first and second local bit lines;

a first selection line that is commonly connected to gates of the first grounding transistor and the second connection transistor; and a second selection line that is commonly connected to gates of the first connection transistor and the second grounding transistor.

2. A ferroelectric memory device according to claim 1, comprising:

a second main bit line adjacent to the first main bit line;

third and fourth local bit lines associated with the second main bit line;

third and fourth connection transistors for connecting the third and fourth local bit lines to the second main bit line; and third and fourth grounding transistors for grounding the third and fourth local bit lines, wherein gates of the third connection transistor and the fourth grounding transistor are commonly connected by the first selection line, and gates of the third grounding transistor and the fourth connection transistor are commonly connected by the second selection line.

3. A ferroelectric memory device according to claim 2, comprising a plate line provided traversing the word line, and a plate line driving section that drives the plate line.

4. A ferroelectric memory device according to claim 3, wherein the plate line driving section is provided for each of the first through fourth local bit lines.

5. A ferroelectric memory device according to claim 3, wherein the plate line driving section is commonly shared by the second and third local bit lines.

6. A ferroelectric memory device according to claim 3, wherein the plate line driving section includes a first plate line driving section that is commonly shared by at least the first and fourth local bit lines, and a second plate line driving section that is commonly shared by at least the second and third local bit lines.

7. A ferroelectric memory device according to claim 2, wherein the first through fourth local bit lines are arranged such that common operation states controlled respectively based on the first and second selection lines are continuous in a direction of the word lines.

8. A ferroelectric memory device according to claim 2, wherein a common one of the word lines traverses the first through fourth local bit lines.

* * * * *